(12) United States Patent
Sharma et al.

(10) Patent No.: US 10,606,004 B2
(45) Date of Patent: Mar. 31, 2020

(54) DISTRIBUTED OPTOELECTRONIC RECEIVER

(71) Applicant: Intel Corporation, Santa Clara, CA (US)

(72) Inventors: Jahnavi Sharma, Hillsboro, OR (US); Ganesh Balamurugan, Hillsboro, OR (US); Hao Li, Portland, OR (US); Meer Nazmus Sakib, Berkeley, CA (US); Haisheng Rong, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/995,694

(22) Filed: Jun. 1, 2018

(65) Prior Publication Data

US 2019/0049680 A1 Feb. 14, 2019

(51) Int. Cl.
| | |
|---|---|
| *G02B 6/43* | (2006.01) |
| *H01L 27/146* | (2006.01) |
| *H04B 10/67* | (2013.01) |
| *G02B 6/12* | (2006.01) |
| *H01L 31/12* | (2006.01) |
| *H01L 31/14* | (2006.01) |
| *H04B 10/66* | (2013.01) |

(52) U.S. Cl.
CPC ........... *G02B 6/43* (2013.01); *G02B 6/12007* (2013.01); *H01L 27/14643* (2013.01); *H01L 31/12* (2013.01); *H01L 31/14* (2013.01); *H04B 10/66* (2013.01); *H04B 10/677* (2013.01)

(58) Field of Classification Search
CPC . G02B 6/43; G02B 6/12007; H01L 27/14643; H01L 31/12; H04B 10/677
See application file for complete search history.

(56) References Cited

U.S. PATENT DOCUMENTS

| | | | |
|---|---|---|---|
| 2009/0087197 A1* | 4/2009 | Welch | H04L 25/0272 398/209 |
| 2009/0097865 A1* | 4/2009 | Guckenberger | H04B 10/6972 398/202 |
| 2011/0008060 A1* | 1/2011 | Kucharski | H03F 3/08 398/202 |
| 2011/0206322 A1* | 8/2011 | Kucharski | G02B 6/4274 385/39 |

(Continued)

OTHER PUBLICATIONS

A. Arbabian and A. M. Niknejad, "A broadband distributed amplifier with internal feedback providing 660 GHz GBW in 90nm CMOS," IEEE International Solid-State Circuits Conference—Digest of Technical Papers, San Francisco, 2008, pp. 196-606.

(Continued)

*Primary Examiner* — Mina M Shalaby
(74) *Attorney, Agent, or Firm* — Patent Capital Group

(57) ABSTRACT

Embodiments herein may relate to an optoelectronic receiver that includes a photonic integrated circuit (PIC) coupled with a light source. Respective PIC sections of the PIC may include a photodiode and a junction capacitor. The optoelectronic receiver may further include an electronic integrated circuit (EIC) coupled with the PIC. Respective EIC sections of the EIC may be communicatively coupled to respective ones of the PIC sections. Other embodiments may be described and/or claimed.

20 Claims, 3 Drawing Sheets

(56) References Cited

U.S. PATENT DOCUMENTS

| | | | | |
|---|---|---|---|---|
| 2011/0267676 | A1* | 11/2011 | Dallesasse | H01S 5/021 359/279 |
| 2012/0007681 | A1* | 1/2012 | Welch | H03F 1/34 330/291 |
| 2014/0255042 | A1* | 9/2014 | Kaikkonen | H04B 10/40 398/136 |
| 2017/0093499 | A1* | 3/2017 | Liboiron-Ladouceur | H04B 10/60 |
| 2017/0141853 | A1* | 5/2017 | Welch | H03F 3/085 |
| 2018/0269987 | A1* | 9/2018 | Sun | H04B 10/11 |
| 2018/0364430 | A1* | 12/2018 | Kucharski | G02B 6/4274 |

OTHER PUBLICATIONS

A. Arbabian and A. M. Niknejad, "A three-stage cascaded distributed amplifier with GBW exceeding 1.5THz," IEEE Radio Frequency Integrated Circuits Symposium, Montreal, 2012, pp. 211-214.

A. Arbabian and A. M. Niknejad, "Design of a CMOS tapered cascaded multistage distributed amplifier," IEEE Transactions on Microwave Theory and Techniques, vol. 57, No. 4, pp. 938-947, Apr. 2009.

C. Y. Hsiao et. al., "CMOS distributed amplifiers using gate-drain transformer feedback technique," IEEE Transactions on Microwave Theory and Techniques, vol. 61, No. 8, pp. 2901-2910, Aug. 2013.

I.G.Lopez et. al., "100 Gb/s Differential Linear TIAs With Less Than 10 pA/√Hz in 130-nm SiGe:C BiCMOS," IEEE Journal of Solid-State Circuits, vol. 53, No. 2, Feb. 2018.

J. Kim et. al., "A 12 dBm 320 GHz GBW distributed amplifier in 0.12 μm SOI CMOS," IEEE ISSCC Digest of Technical Papers, San Francisco, USA, 2004, pp. 478-479.

J.C. Chien and L.H. Lu, "40-Gb/s high-gain distributed amplifiers with cascaded gain states in 0.18 μm CMOS," IEEE Journal of Solid-State Circuits, vol. 42, No. 12, Dec. 2007.

K. Moez and M. Elmasry, "A 10 dB 44 GHz loss-compensated CMOS distributed amplifier," IEEE ISSCC Digest of Technical Papers, San Francisco, USA, 2007, pp. 548-549.

S. Kudszus et. al., "A 46-GHz distributed transimpedance amplifier using SiGe bipolar technology," IEEE MTT-S International Microwave Symposium Digest, Philadelphia, USA, 2003, pp. 1387-1390.

H.. Shigematsu et. al., "40 Gb/s CMOS distributed amplifier for fiber-optic communication systems," IEEE ISSCC Digest of Technical Papers, San Francisco, USA, 2004, pp. 476-477.

J. D. Jin and S. S. H. Hsu, "A miniaturized 70-GHz broadband amplifier in 0.13 μm CMOS technology," IEEE Transactions on Microwave Theory and Techniques, vol. 56, No. 12, pp. 3086-3092, Dec. 2008.

* cited by examiner

DISTRIBUTED OPTOELECTRONIC RECEIVER

FIELD

Embodiments of the present disclosure generally relate to the field of optoelectronic receivers.

BACKGROUND

Silicon (Si) waveguide-based photodiodes (PDs) may be a viable low-cost solution in high-speed optical transceiver products for applications such as data center interconnects. Additionally, Si PDs offer better ease of integration with low-cost Si-based electronics in very high-speed optical communication links that currently use III-V or Germanium (Ge)-based solutions for the photodiode.

However, Si PDs may demonstrate lower responsivity than Ge counterparts for a given p-n junction length. To compensate for this lower responsivity, Si PDs may be made longer, but the concomitant junction capacitance—which can be up to 8× larger than Ge PDs for achieving the same responsivity, may present a bottleneck in high-data-rate links. More specifically, this higher photodiode capacitance may lower the sensitivity of the optical receiver, as optical receiver sensitivity may be a function of photodiode capacitance in that the higher the photodiode capacitance, the lower the optical receiver sensitivity.

DETAILED DESCRIPTION

Figure 1:
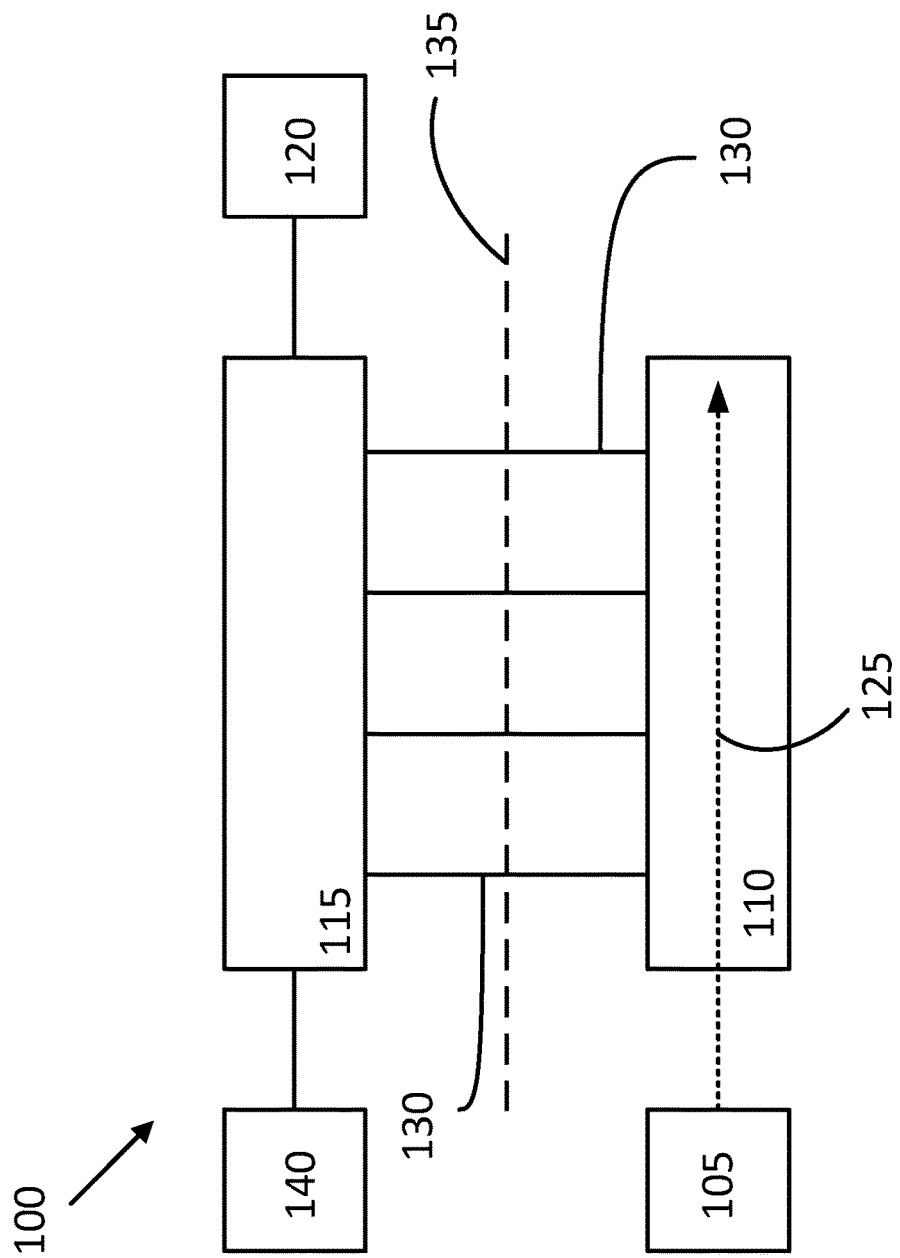
FIG. 1 illustrates an example system that may use an optoelectronic receiver with distributed electronic and photonic domains, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical and/or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Legacy optoelectronic receivers may have included a 46 gigahertz (GHz) distributed transimpedance amplifier (TIA) with a standard traveling wave topology. A lumped hybrid photodiode may inject current at one end of an input transmission line, which is terminated with its characteristic impedance at the other end. Gain cells may tap the voltage along the input line and generate proportional currents that feed an output transmission line which is delay-matched to the input line. The output transmission line may also be terminated with its characteristic impedance at both ends.

However, the efficacy of legacy optoelectronic receivers may be limited, as they attempt to improve receiver performance with a lumped photodiode implementation. Specifically, as noted above, some legacy optoelectronic receivers may use a distributed approach for a transimpedance amplifier (TIA). Other legacy optoelectronic receivers may use general purpose amplifiers for broadband optical communication. However, these topologies may not adequately address the effect of a large PD capacitance, which may attenuate the input bandwidth and invalidate any advantage in bandwidth from distributing the following stages or using other general purpose broadband approaches for the amplifier alone. This attenuation and invalidation may make use of a Si PD unsuitable for low-cost integrated solutions for optical links.

Embodiments herein may extend the distributed architecture approach across both the electronic and photonic domain of an optoelectronic receiver. Specifically, the Si PD may be split or distributed into a plurality of smaller sections, each of which may drive a corresponding gain cell in the distributed TIA implementation. Embodiments herein may provide two benefits. Firstly, embodiments may mitigate the effect of large junction capacitance by splitting the total PD capacitance into smaller values which may not attenuate the input bandwidth of the corresponding electronic gain cell. Secondly, embodiments may enable a truly broadband combination of the responses of the individual gain cells to their respective PD sections. In other words, embodiments herein may enable traveling wave amplifier topologies that are broader band than legacy techniques that may limit distribution to only the electrical domain, or may not use distribution at all. More specifically, embodiments herein may substantially improve receiver sensitivity by ameliorating the bandwidth and group-delay impact of large silicon photodiode capacitance in optoelectronic receivers.

FIG. 1 illustrates a high-level diagram of an example system that may use an optoelectronic receiver with distributed electronic and photonic domains, in accordance with various embodiments. The electronic and photonic domains are indicated by the lateral dashed line 135 in FIG. 1. The optoelectronic receiver 100 may include a photonic integrated circuit (PIC) 110 in the photonic domain. In some embodiments the PIC may also be referred to as a distributed PD. The PIC 110 may be coupled with a light source 105 which may be a laser, a light emitting diode (LED), an array of lasers or LEDs, or some other type of light source. In other embodiments, the light source 105 may be an optical fiber such as a silicon optical fiber or a single mode fiber (SMF) that is transferring light from another source such as another photoelectronic chip. The light 125, represented by the dashed line in FIG. 1, may exit the light source 105 and enter the PIC 110. Although the light source 105 and the PIC 110 are shown as physically separated in FIG. 1, in other embodiments the light source 105 and the PIC 110 may be directly adjacent to one another or physically coupled to one another. In some embodiments here may be one or more additional elements or electronic components positioned between the light source 105 and the PIC 110.

The optoelectronic receiver 100 may also include an electronic integrated circuit (EIC) 115 in the electronic domain. In some embodiments the EIC may also be referred to as a distributed TIA. An electrical output 120 may be coupled with the EIC 115 (as shown in FIG. 1), while in other embodiments the electrical output 120 may be a part of the EIC 115. More specifically, in embodiments the electrical output 120 may be an on-chip or an off-chip electrical termination. Additionally or alternatively, the electrical output 120 may include a subsequent on-chip or off-chip electronic stage. In some embodiments, one or more additional elements or electronic components may be positioned between the electrical output 120 and the EIC 115.

Additionally, optoelectronic receiver 100 may include an electrical input 140 coupled with the EIC 115. Similarly to the electrical output 120, the electrical input 140 may be an on-chip or an off-chip electrical termination. Additionally or alternatively, the electrical input 140 may include an on-chip or an off-chip electronic stage. The electrical input 140 may be to assist the termination 222 in changing the reflection or absorption of the electrical wave in sections 238-238N.

In embodiments, the EIC 115 and the PIC 110 may be connected to one another via a plurality of gain lines 130. Specifically, the PIC 110 may include a number of PIC sections that are serially coupled to the light source 105. Each PIC section may include a PD and a junction capacitor. Similarly, the EIC 115 may include a number of EIC sections that are serially coupled with one another. Each of the PIC sections may be coupled with an EIC section via a gain line 130. FIG. 1 depicts 4 gain lines 130, however in other embodiments the optoelectronic receiver 100 may have more or fewer gain lines 130 than depicted in FIG. 1. The EIC sections and PIC sections are explained in greater detail with respect to FIG. 2.

Generally, in operation light may be received at the optoelectronic receiver 100 by the PIC 110 from the light source 105. The PD of each PIC section may interact with the light 125 to create a current. The current from each PIC section may be transmitted, via gain lines 130, from the PIC sections of the PIC 110 to the EIC sections of the EIC 115. The output currents of each of the EIC sections may then be summed before being output at the electrical output 120. The electrical output 120 may be communicatively coupled with, or be part of, for example a processor that is able to extract data from the output current or voltage. In this manner, data communicated via light that enters the optoelectronic receiver 100 via the light source 105 may be extracted by the optoelectronic receiver 100 and communicated as electronic signals via the electrical output 120.

Notably, the responsivity of an optoelectronic receiver such as optoelectronic receiver 100 may increase with PD length. However, the PD length required to deliver adequate responsivity results in a large capacitive load. In other words, a relatively large junction capacitor may be necessary to accommodate a PD with the length necessary to deliver adequate responsivity. However, as discussed above, the relatively large junction capacitor may attenuate the input bandwidth and negatively affect the performance of the optoelectronic receiver 100. However, by distributing the PD junction capacitance between a plurality of PIC sections in 110, embodiments herein may realize various advantages by decreasing the capacitance experienced by each of the PIC sections, thereby increasing the input bandwidth of the PIC 110 and, resultantly, the overall bandwidth of optoelectronic receiver 100. This may mitigate the effect of the increased junction capacitance on the sensitivity of the optoelectronic receiver 100.

Figure 2:
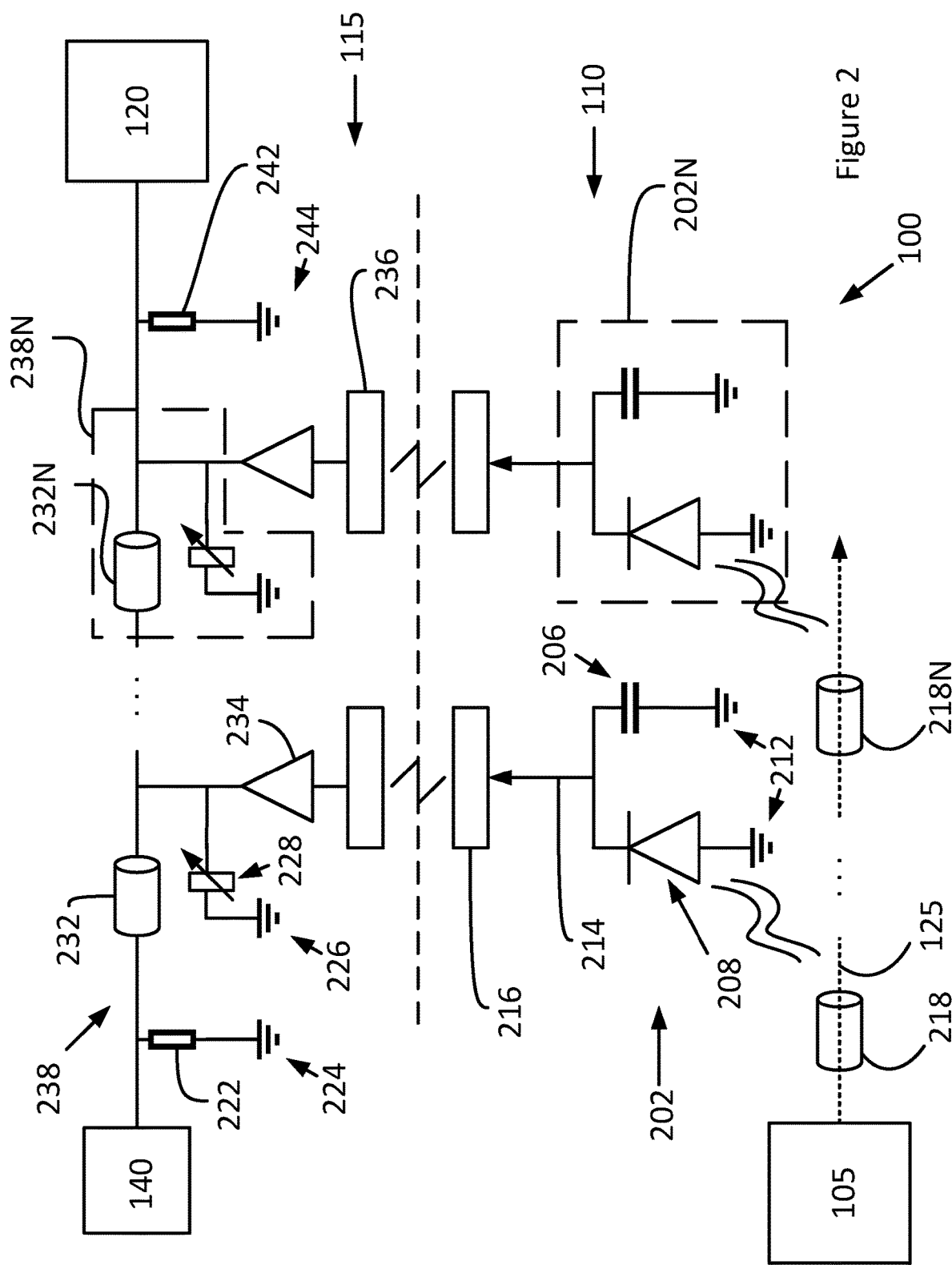
FIG. 2 illustrates an example circuit diagram of the optoelectronic receiver of FIG. 1, in accordance with various embodiments.

FIG. 2 illustrates an example circuit diagram of the example optoelectronic receiver 100 of FIG. 1, in accordance with various embodiments. The optoelectronic receiver 100 may include a PIC 110 and an EIC 115 as described above with respect to FIG. 1. The EIC may be coupled with, or may include, electrical output 120. Similarly, the PIC may be coupled with, or include, light source 105 which is configured to introduce light 125 through the PIC.

For the purposes of description of FIG. 2, it will be noted that the Figure may included repeated sections such as a number of PIC sections 202 and 202N, or a number of EIC sections 238 and 238N. Generally, a dashed line is drawn around one of the EIC sections 238N and one of the PIC sections 202N to depict elements that may, in some embodiments, be considered within those sections. However, in some embodiments the various sections may have additional elements, or certain elements (such as ground 212 in the PIC sections 202 and 202N) may be combined or outside of the sections. For example, in some embodiments the PIC 110 or one or more of the PIC sections 202/202N may have additional PD parasitic elements such as a diode resistor, a contact resistor, etc. Additionally, for the sake of clarity elements of section 202 may be enumerated and given callouts, however those numerals and callouts may not be repeated for PIC section 202N. Unless explicitly noted, it may be assumed that descriptions of, for example junction capacitor 206 or PD 208 of PIC section 202 may additionally apply to the junction capacitor and PD of PIC section 202N. Similarly, unless explicitly noted, descriptions of elements given with respect to EIC section 238 may apply to elements of EIC section 238N. It will also be understood that the elements described with respect to EIC sections 238/238N are intended as examples and in other embodiments one or more of the EIC sections may have additional or alternative elements.

The PIC sections 202 and 202N may include a PD 208 in parallel with a junction capacitor 206. Both the junction capacitor 206 and the PD 208 may be coupled with ground 212. In some embodiments, the junction capacitor 206 may have a capacitance of approximately 50 femtofarads (fF) to approximately 200 fF. More specifically, in some embodiments the junction capacitor 206 may have a capacitance of approximately 100 fF. In some embodiments, the capacitance of the junction capacitor 206 of each of the PIC sections 202-202N may be the same, or approximately the same as one another. In other embodiments, the capacitance of the junction capacitor 206 of each of the PIC sections 202-202N may differ from one another.

Generally, the PIC 110 may have N sections. In FIG. 2, N is equal to 2, however other embodiments may have between 2 and 8 sections, however in other embodiments the PIC 110 may have greater than 8 sections. In some embodiments, it may be desirable for the PIC 110 to have an overall junction capacitance of between approximately 100 fF and approximately 1.6 picofarads (pF). The number of sections N may then, for example, be based off of a capacitance value of the junction capacitor 206 and a desired overall junction capacitance of the PIC 110. In other words, the number of sections may be based on how many junction capacitors 206 are necessary to reach the desired overall junction capacitance of the PIC 110.

In embodiments, the PDs 208 may interact with the light 125 as the light 125 passes through the PIC sections 202-202N, and create a current at 214. The current at 214 may then be received at a plurality of photonic pads 216 that are respectively communicatively coupled with the PIC sections 202-202N as shown in FIG. 2. In some embodiments, the current produced by a PD 208 and received at a photonic pad 216 may be identical to the current received at another photonic pad 216. However, in other embodiments the current received at a kth photonic pad (where k is a number between 1 and N) may be scaled by a factor $A_k$ as optical power of the light 125 attenuates along the length of the PIC 110.

It will be understood that in some embodiments the photonic pads 216 may not be physically separated from one another, but rather two or more of the pads may be physically coupled with each other but communicatively separated from one another, for example by a dielectric material. In some embodiments, a single photonic pad 216 may be coupled with a plurality of PIC sections 202-202N. As used herein, a photonic pad may refer to a pad in the photonic domain. The photonic pads 216 may include copper, gold, alloys thereof, or some other conductive material.

The EIC 115 may also include one or more electrical pads 236. As used herein an electrical pad 236 may refer to a pad in the electronic domain. Similarly to the photonic pads 216, the electrical pads 236 may include copper, gold, alloys thereof, or some other conductive material. Respective ones of the electrical pads 236 may be communicatively coupled with EIC sections 238-238N. Similarly to the photonic pads 216, in some embodiments a single electrical pad 236 may be coupled with a plurality of EIC sections 238-238N. In some embodiments two or more of the electrical pads may not be physically separated from one another, but rather two or more of the pads may be physically coupled with one another, but communicatively separated from one another, for example by a dielectric material. In some embodiments, the photonic pads 216 and the electrical pads 236 may be wire-bonded to one another, or one of the pads may be coupled with another in a flip-chip configuration. Alternatively, in a monolithic silicon photonics process, the connection between the two pads can be on-die. In some embodiments where a monolithic silicon photonics process is used, there may be no pads, rather the pads may be replaced by a direct communicative coupling between the EIC 115 and the PIC 110.

In embodiments the EIC may include an amplifier 234 positioned between each of the electrical pads 236 and the EIC sections 238-238N. Each amplifier 234 may have the same gain, whereas in other embodiments each amplifier may have a different gain. In some embodiments, the amplifier 234 may be linear with a gain $G_k$ in the EIC 115. Specifically, the gain $G_k$ may be the gain of the kth amplifier. In embodiments, the gain $G_k$ may be made variable across sections of the EIC 115 to accommodate the changing amplitude of the current across the various sections. Generally, the photonic pads 216, the electrical pads 236, and the amplifier 234 may correspond to the gain line 130 of FIG. 1.

Generally, the amplifier 234 may be considered to be a general purpose amplifier. The amplifier 234 may, for example, include a variety of transistor or passive device networks that may overcome traditional traveling wave distributed amplifier challenges. These challenges may include, for example, higher gain and bandwidth in the amplifiers 234, or loss in the EIC sections 238-238N.

As noted above, the EIC 115 may then include a plurality of EIC sections 238-238N. In embodiments, the number N of EIC sections may be equivalent to the number N of PIC sections. However, in other embodiments the EIC 115 may include more or fewer EIC sections than there are PIC sections.

Respective ones of the EIC sections 238-238N may include a tunable electrical termination 228 coupled on one side to an output of the amplifier 234, and on the other side to ground 226. The EIC sections 238-238N may also include an electrical delay section 232, which will be discussed in further detail below. The delay in respective ones of the electrical delay section 238 may be of the order of between approximately 1.3 and approximately 1.5 picoseconds (ps). The tunable element 228 may be to tune the electrical characteristics of the electrical delay section 232. Electrical characteristics may include but are not limited to propagation delay and characteristic impedance. The electrical element 228 may be, but is not limited to a output loading of the amplifier 234, a capacitor, a capacitively-bypassed inductor, or a combination of tunable active and passive electrical components. The electrical element 228 may be a capacitor of value approximately 15-30 fF, and may be used to match the propagation delay in the EIC sections 238 to PIC sections 202.

The EIC 115 may also include an electrical termination 222 that is coupled to ground 224. The electrical termination 222 may control the characteristics of the traveling wave in EIC sections 238-238N by modifying wave reflection and absorption at the electrical termination 222 or the electrical input 140. The EIC 115 may also include an electrical termination 242 coupled to ground 244. The electrical termination 242 may control the characteristics of the traveling wave in EIC sections 238-238N by modifying wave reflections and absorption at the electrical termination 242, independently or in conjunction with electrical termination 222. The electrical terminations 222 and 242 may be, but are not limited to, resistors matched to the characteristic impedance of the electrical sections 238-238N, which may receive a constructive combination of photodiode currents amplified by the amplifier 234.

In embodiments, the PIC 110 may include a plurality of photonic delay sections 218-218N. As shown in FIG. 2, in some embodiments the photonic delay sections 218-218N may be considered to be separate from the PIC sections 202-202N. In other embodiments, the photonic delay sections 218-218N may be considered to be integral elements of the PIC sections 202-202N. In some embodiments, there may be the same number of photonic delay sections as there are PIC sections, while in other embodiments there may be more or fewer photonic delay sections than there are PIC sections. Generally, in some embodiments respective ones of the photonic delay sections 218-218N may be implemented in an extension of the photonic waveguide along which the light 125 is propagating. In other words, a photonic delay section 218 may be an increased length of silicon waveguide inserted between the various PIC sections 202-202N. In some embodiments, each of the photonic delay sections 218-218N may have a same length as each other, while in other embodiments one or more of the photonic delay sections may have a different length than another of the photonic delay sections. In some embodiments, the length of the photonic delay sections may be between approximately 100 micrometers (μm) and approximately 250 μm. The length of the photonic delay sections may, in some embodiments, be meandered to fit the pitch between photonics pads 216 for compact implementations. In other words, in some embodiments the various photonic delay sections may be routed between or around various of the photonic pads 216 in the compact implementations.

The EIC 115 may also include a plurality of electrical delay sections 232-232N. In some embodiments, respective ones of the electrical delay sections 232-232N may be implemented as spiral inductors. This may enable compact implementations. In embodiments, the spiral inductors may be characterized by their inductance $L_{spiral}$. In some embodiments, each of the spiral inductors may have a value of $L_{spiral}$, which may be between approximately 100 and approximately to 300 picohenries (pH). However, in some embodiments one or more of the spiral inductors may have a value that is different than another of the spiral inductors. For example, in some embodiments the electrical delay section 232, that is, the first electrical delay section may have a value of $L_{spiral}/2$. Similarly, there may be an additional electrical delay section (not shown in FIG. 2) that may be positioned between EIC section 238N and the electrical termination 242 that may have a value of $L_{spiral}/2$. The purpose of the modifications in spiral values in sections 232-232N rather than $L_{spiral}$ may be to better approximate a real broadband transmission line.

The spiral inductors may be used instead of transmission lines for a plurality of benefits. For example, the spiral inducts may reduce the loss in a given EIC section because the spirals may have a higher inductance per unit length than a transmission line due to mutual coupling between turns of the spiral inductor. Additionally, the spiral inductors may reduce the area of the overall topology of the EIC 115. In other words, the spiral inductors may take up less space. In some embodiments, the Bragg frequency, that is, the frequency at which the EIC sections may cease to act as a transmission line, may inform the choice of the spiral inductor. The Bragg frequency of the respective EIC sections 238-238N may be chosen to be greater than approximately 5× the symbol rate to prevent attenuation of dominant harmonics in the input data propagating through the EIC 115. As used herein, symbol rate may refer to the speed of the input data that has been modulated into the light 125.

In one embodiment, the electrical delay sections 232-232N and the photonic delay sections 218-218N may operate in conjunction with one another to delay the light (in the case of the PIC 110) or electrical wave (in the case of the EIC 115) such that the current observed at the electrical output 120 combines constructively in phase. More generally, the output current of each of the EIC sections 238-238N may be summed in a broadband manner by using another transmission line terminated with its characteristic impedance (e.g., by electrical terminations 222, 242, or some other electrical termination). The transmission line may absorb the parasitic output capacitance of each of the EIC sections 238-238N to remove the bandwidth limitation of the EIC 115. By matching the delay of each of the PIC sections 202-202N (the delay based, for example, on photonic delay sections 218-218N) to the delay of each of the EIC section 238-238N (the delay based, for example, on electrical delay sections 232-232N), the current from each of the amplifiers 234 may have the same cumulative delay at the electrical output 120. As a result the currents from each of the EIC sections 238-238N may be in phase at the electrical output 120, and add constructively to provide a gain that may be based, for example, on a summation of the current produced by PD 208 and amplifier 234. This cumulative gain may be consistent with a traveling wave distributed amplifier topology.

More generally, in embodiments, the PIC sections 202-202N and EIC sections 238-238N may modify an electrical waveform within the EIC 115. For example, in embodiments the PIC sections 202-202N and the EIC sections 238-238N may modify the waveform within the EIC 115 such that the current at the electrical output 120 is in phase as described above. However, in other embodiments the waveform may be modified in some other manner such that the current is only partially in phase, out of phase, or some other aspect of the waveform or the current is altered.

The use of embodiments herein may enable a truly broadband combination of the outputs of the amplifiers 234. This broadband combination may be useful in optical links, where narrowband power combination techniques such as direct combination, transformer-based voltage combining, or matched-combiner techniques may not be effective.

Figure 3:
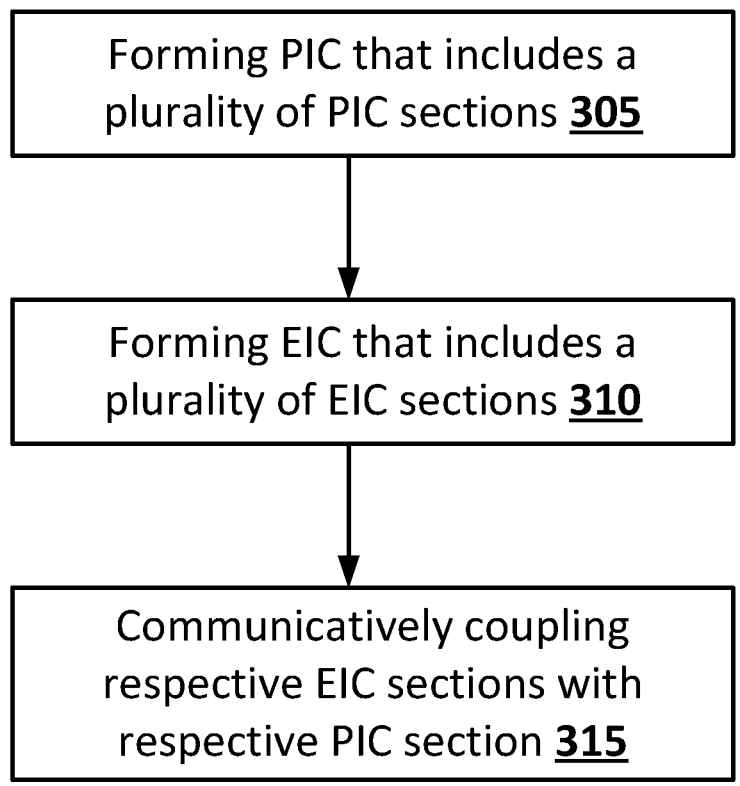
FIG. 3 illustrates an example process for manufacturing the optoelectronic receiver of FIG. 1 or 2, in accordance with various embodiments.

FIG. 3 illustrates an example process for manufacturing the optoelectronic receiver 100 of FIG. 1 or 2, in accordance with various embodiments. The process may include forming, at 305, a PIC such as PIC 110. The PIC 110 may include a plurality of PIC sections such as PIC sections 202-202N. In embodiments, respective ones of the PIC sections 202-202N may include a junction capacitor such as junction capacitor 206 or a PD such as PD 208. The PIC may also include a plurality of photonic delay sections such as photonic delay sections 218-218N.

The process may also include forming, at 310, an EIC such as EIC 115. The EIC may include a plurality of EIC sections such as EIC sections 238-238N. Respective ones of the EIC sections may include an electrical delay section such as electrical delay sections 232-232N or an electrical termination such as termination 228 as described herein.

The process may also include communicatively coupling, at 315, respective EIC sections of the EIC with respective PIC sections of PIC. The coupling may include, for example, communicatively coupling one or more gain lines such as gain lines 130 to respective ones of the EIC sections and the PIC sections. More specifically, the respective gain lines may include elements such as an electrical pad 236, a photonic pad 216, or am amplifier 234 as described herein.

It will be understood that the process of FIG. 3 is described in one order, however in other embodiments certain parts of the process may be performed either in parallel, or in a different order. For example, in some embodiments the EIC may be formed at 310 prior to, or in parallel with, PIC 305. Additionally, in some embodiments the process may include additional or alternative steps.

Examples

Example 1 may include an optoelectronic receiver comprising: a photonic integrated circuit (PIC) coupled with a light source, wherein the PIC includes a plurality of PIC sections coupled with the light source, wherein respective PIC sections include a photodiode and a junction capacitor; and an electronic integrated circuit (EIC) coupled with the PIC, wherein the EIC includes a plurality of EIC sections, wherein respective ones of the EIC sections are communicatively coupled to respective ones of the PIC sections.

Example 2 may include the system of example 1, wherein the plurality of PIC sections are serially coupled with the light source.

Example 3 may include the system of example 1, wherein a number of the EIC sections and a number of the PIC sections is based on a total capacitance of the respective junction capacitors of the PIC sections.

Example 4 may include the system of any of examples 1-3, wherein at least one EIC section of the plurality of EIC sections includes an electrical delay section, and wherein at least one PIC section of the plurality of PIC sections includes a photonic delay section.

Example 5 may include the system of example 4, wherein the electrical delay section includes a spiral inductor.

Example 6 may include the system of example 4, wherein the electronic integrated circuit further include an electrical output, and wherein the photonic delay section and the electrical delay section are to modify an electrical waveform within the EIC.

Example 7 may include the system of example 6, wherein the electrical delay section and the photonic delay section are to cause the electrical waveform at the electrical output to be in phase based on a length of the photonic delay section and an impedance of the electrical delay section.

Example 8 may include the system of any of examples 1-3, wherein respective one of the PIC sections include a photonic pad and respective ones of the EIC sections include an electrical pad communicatively coupled to a photonic pad.

Example 9 may include a method for generating an optoelectronic receive, the method comprising: forming a photonic integrated circuit (PIC) that includes a plurality of PIC sections, wherein respective PIC sections include a photodiode and a junction capacitor, and wherein the plurality of PIC sections are to couple with a light source; forming an electronic integrated circuit (EIC), wherein the EIC includes a plurality of EIC sections; and communicatively coupling respective EIC sections of the plurality of EIC sections with respective PIC sections of the plurality of PIC sections.

Example 10 may include the method of example 9, wherein the plurality of PIC sections are to serially couple with the light source.

Example 11 may include the method of example 9, wherein a number of the EIC sections and a number of the PIC sections is based on a total capacitance of the respective junction capacitors of the PIC sections.

Example 12 may include the method of example 9, wherein respective EIC sections include an electrical pad that is communicatively coupled with a photonic pad of a respective PIC section.

Example 13 may include the method of any of examples 9-12, further comprising coupling the PIC with the light source.

Example 14 may include the method of any of examples 9-12, wherein at least one EIC section of the plurality of EIC sections includes an electrical delay section, and wherein at least one PIC section of the plurality of PIC sections includes a photonic delay section.

Example 15 may include the method of example 14, wherein the photonic delay section and the electrical delay section are to modify an electrical waveform within the EIC.

Example 16 may include a computing system comprising: a light source; and an optoelectronic receiver, wherein the optoelectronic receiver includes: a photonic integrated circuit (PIC) coupled with the light source, wherein the PIC includes a plurality of PIC sections coupled with the light source, wherein respective PIC sections include a photodiode, a junction capacitor, and a photonic delay section; and an electronic integrated circuit (EIC) coupled with the PIC, wherein the EIC includes a plurality of EIC sections, wherein respective ones of the EIC sections include an electrical delay section and are communicatively coupled to respective ones of the PIC sections.

Example 17 may include the system of example 16, wherein the plurality of PIC sections are serially coupled with the light source.

Example 18 may include the system of example 16, wherein a number of the EIC sections and a number of the PIC sections is based on a total capacitance of the respective junction capacitors of the PIC sections.

Example 19 may include the system of example 16, wherein the electrical delay section includes a spiral inductor.

Example 20 may include the system of any of examples 16-19, wherein the electronic integrated circuit further include an electrical output, and wherein the photonic delay section and the electrical delay section are to modify an electrical waveform within the EIC.

Example 21 may include the system of example 20, wherein the electrical delay section and the photonic delay section are to cause the electrical waveform at the electrical output to be in phase based on a length of the photonic delay section and an impedance of the electrical delay section.

Example 22 may include the system of any of examples 16-19, wherein respective one of the PIC sections include a photonic pad and respective ones of the EIC sections include an electrical pad communicatively coupled to a photonic pad.

Example 23 may include a photonic integrated circuit (PIC) comprising: a first PIC section to couple with a light source, wherein the first PIC section includes a first photodiode, a first junction capacitor, and a first photonic delay section; and a second PIC section coupled with the first PIC section, wherein the second PIC section is to couple with the light source and the second PIC section includes a second photodiode, a second junction capacitor, and a second photonic delay section.

Example 24 may include the PIC of example 23, wherein the first PIC section and the second PIC section are to serially couple with the light source such that the first PIC section is positioned between the second PIC section and the light source with respect to light from the light source.

Example 25 may include the PIC of example 23, wherein the first PIC section is to couple with a first electronic integrated circuit (EIC) section of an EIC, and the second PIC section is to couple with a second EIC section of the EIC.

Example 26 may include the PIC of example 25, wherein the first EIC section includes a first electrical delay section, and the second EIC section includes a second electrical delay section.

Example 27 may include the PIC of example 26, wherein the first electrical delay section, the second electrical delay section, the first photonic delay section, and the second photonic delay section are to modify an electrical waveform within the EIC.

Example 28 may include the PIC of example 27, wherein the first electrical delay section, the second electrical delay section, the first photonic delay section, and the second photonic delay section are to cause the electrical waveform to be in phase at an output of the EIC.

Example 29 may include the PIC of any of examples 23-28, wherein a number of PIC sections of the PIC is based on a total capacitance of junction capacitors of respective PIC sections of the PIC.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An optoelectronic receiver comprising:
a photonic integrated circuit (PIC) coupled with a light source, wherein the PIC includes a plurality of PIC sections coupled with the light source, wherein respective PIC sections include a photodiode and a junction capacitor; and
an electronic integrated circuit (EIC) coupled with the PIC, wherein the EIC includes a plurality of EIC sections, wherein respective ones of the EIC sections are communicatively coupled to respective ones of the PIC sections, and wherein respective ones of the EIC sections include an electrical delay section with an electrical delay that is based on a photonic delay of a respective PIC section to which the respective ones of the EIC sections are coupled.

2. The system of claim 1, wherein the plurality of PIC sections are serially coupled with the light source.

3. The system of claim 1, wherein a number of the EIC sections and a number of the PIC sections is based on a total capacitance of the respective junction capacitors of the PIC sections.

4. The system of claim 1, wherein at least one PIC section of the plurality of PIC sections includes a photonic delay section.

5. The system of claim 4, wherein the electrical delay section includes a spiral inductor.

6. The system of claim 4, wherein the electronic integrated circuit further include an electrical output, and wherein the photonic delay section and the electrical delay section are to modify an electrical waveform within the EIC.

7. The system of claim 6, wherein the electrical delay section and the photonic delay section are to cause the electrical waveform at the electrical output to be in phase based on a length of the photonic delay section and an impedance of the electrical delay section.

8. The system of claim 1, wherein respective one of the PIC sections include a photonic pad and respective ones of the EIC sections include an electrical pad communicatively coupled to a photonic pad.

9. A computing system comprising:
a light source; and
an optoelectronic receiver, wherein the optoelectronic receiver includes:
a photonic integrated circuit (PIC) coupled with the light source, wherein the PIC includes a plurality of PIC sections coupled with the light source, wherein respective PIC sections include a photodiode, a junction capacitor, and a photonic delay section; and
an electronic integrated circuit (EIC) coupled with the PIC, wherein the EIC includes a plurality of EIC sections, wherein respective ones of the EIC sections include an electrical delay section and are communicatively coupled to respective ones of the PIC sections, wherein an electrical delay section of an EIC section has an electrical delay that is related to a photonic delay of a PIC section to which the EIC section is coupled.

10. The system of claim 9, wherein the plurality of PIC sections are serially coupled with the light source.

11. The system of claim 9, wherein a number of the EIC sections and a number of the PIC sections is based on a total capacitance of the respective junction capacitors of the PIC sections.

12. The system of claim 9, wherein the electronic integrated circuit further include an electrical output, and wherein the photonic delay section and the electrical delay section are to modify an electrical waveform within the EIC.

13. The system of claim 9, wherein respective one of the PIC sections include a photonic pad and respective ones of the EIC sections include an electrical pad communicatively coupled to a photonic pad.

14. A method for generating an optoelectronic receiver, the method comprising:
forming a photonic integrated circuit (PIC) that includes a plurality of PIC sections, wherein respective PIC sections include a photodiode and a junction capacitor, and wherein the plurality of PIC sections are to couple with a light source;
forming an electronic integrated circuit (EIC), wherein the EIC includes a plurality of EIC sections, and wherein at least one EIC section of the plurality of EIC sections includes an electrical delay section with an electrical delay that is based on a photonic delay of a PIC section to which the EIC section will be coupled; and communicatively coupling respective EIC sections of the plurality of EIC sections with respective PIC sections of the plurality of PIC sections.

15. The method of claim 14, wherein the plurality of PIC sections are to serially couple with the light source.

16. The method of claim 14, wherein a number of the EIC sections and a number of the PIC sections is based on a total capacitance of the respective junction capacitors of the PIC sections.

17. The method of claim 14, wherein respective EIC sections include an electrical pad that is communicatively coupled with a photonic pad of a respective PIC section.

18. The method of claim 14, further comprising coupling the PIC with the light source.

19. The method of claim 14, wherein at least one PIC section of the plurality of PIC sections includes a photonic delay section.

20. The method of claim 14, wherein forming the EIC includes coupling respective EIC sections of the plurality of EIC sections in series with one another.

* * * * *

UNITED STATES PATENT AND TRADEMARK OFFICE
CERTIFICATE OF CORRECTION

PATENT NO. : 10,606,004 B2  
APPLICATION NO. : 15/995694  
DATED : March 31, 2020  
INVENTOR(S) : Jahnavi Sharma et al.

Page 1 of 1

It is certified that error appears in the above-identified patent and that said Letters Patent is hereby corrected as shown below:

In the Claims

In Column 12, Line 3, in Claim 2, delete "system;" and insert -- optoelectronic receiver --, therefor.

In Column 12, Line 5, in Claim 3, delete "system;" and insert -- optoelectronic receiver --, therefor.

In Column 12, Line 9, in Claim 4, delete "system;" and insert -- optoelectronic receiver --, therefor.

In Column 12, Line 12, in Claim 5, delete "system;" and insert -- optoelectronic receiver --, therefor.

In Column 12, Line 14, in Claim 6, delete "system;" and insert -- optoelectronic receiver --, therefor.

In Column 12, Line 18, in Claim 7, delete "system;" and insert -- optoelectronic receiver --, therefor.

In Column 12, Line 23, in Claim 8, delete "system;" and insert -- optoelectronic receiver --, therefor.

Signed and Sealed this  
Second Day of June, 2020

Andrei Iancu  
*Director of the United States Patent and Trademark Office*